(12) United States Patent
Yokoji et al.

(10) Patent No.: US 6,864,679 B2
(45) Date of Patent: Mar. 8, 2005

(54) ROTARY MANIPULATION TYPE INPUT DEVICE AND ELECTRONIC APPARATUS USING THE SAME

(75) Inventors: Shigeru Yokoji, Osaka (JP); Tamotsu Yamamoto, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 71 days.

(21) Appl. No.: 10/390,359

(22) Filed: Mar. 17, 2003

(65) Prior Publication Data

US 2003/0224737 A1 Dec. 4, 2003

(30) Foreign Application Priority Data

Mar. 22, 2002 (JP) ........................................ 2002-080354

(51) Int. Cl.[7] ................................................ G01B 7/30
(52) U.S. Cl. ............................ 324/207.11; 324/207.25; 335/205; 200/404
(58) Field of Search ............................ 335/205–207; 200/404; 324/207.11, 207.13, 207.2, 207.25, 207.26

(56) References Cited

U.S. PATENT DOCUMENTS 5,867,082 A    2/1999  Van Zeeland
6,003,367 A   12/1999  Bux et al.

FOREIGN PATENT DOCUMENTS

| DE | 44 39 157 A1 | 5/1996 |
| DE | 196 46 998 A | 5/1998 |
| EP | 1 026 713 A1 | 8/2000 |
| FR | 2 804 240 A | 7/2001 |

OTHER PUBLICATIONS

European Search Report for EP 03 00 6247, dated Jul. 14, 2003.

*Primary Examiner*—Ramon M. Barrera
(74) *Attorney, Agent, or Firm*—RatnerPrestia

(57) ABSTRACT

A rotary manipulation type input device obtains a specified output by detecting intensity changes of magnetic field due to rotation of an operating element by a detecting element disposed on a substrate beneath a base, using a ring-shaped magnet disposed at the lower side of the operating element disposed rotatably on the base. By rotary manipulation of the operating element, an attractive and repulsive force is generated between the ring-shaped magnetic and the magnetic disposed on the base, so that an operation contact click-feeling is obtained, and therefore the rotary click-feeling and signal output can be synchronized easily, and deterioration of rotary click-feeling is very rare.

5 Claims, 5 Drawing Sheets

ROTARY MANIPULATION TYPE INPUT DEVICE AND ELECTRONIC APPARATUS USING THE SAME

FIELD OF THE INVENTION

The present invention relates to a rotary manipulation type input device for telephone directory retrieval or various input operations, and an electronic apparatus using the same.

BACKGROUND OF THE INVENTION

A rotary manipulation type input device of magnetic system is used for selecting and setting operations of various items displayed on a screen such as character inputs in an electronic apparatus.

Such conventional rotary manipulation type input device is explained below while referring to FIG. 4 and FIG. 5.

FIG. 4 is a sectional view of rotary manipulation type input device of magnetic system in a prior art, and FIG. 5 shows a rotary manipulation click-feeling generating mechanism which is one of the essential parts thereof. In FIG. 4 and FIG. 5, a substrate 101 is a flat plate, which is located in the bottom of the rotary manipulation type input device. A box-shaped case 102 opened downward is coupled above the substrate 101.

A dent 101A is formed in the middle of the top of the substrate 101, and a penetration hole 102A is provided in the top of the case 102 located at its opposite position.

A rotary member 103 is composed by fixing a lower columnar shaft 103A, an upper columnar operation shaft 103B, and a disk 103C. The disk 103C is positioned between the columnar shaft 103A and operation shaft 103B. The disk 103C has a magnet which is not shown. In order that the disk 103C is positioned within an internal space formed by the substrate 101 and case 102, the columnar shaft 103A is rotatably fitted into the dent 101A of the substrate 101. The operation shaft 103B is assembled in a state projecting outward from the penetration hole 102A of the case 102.

Near the periphery of the disk 103C, a detecting element 104 such as MR element capable of detecting intensity changes of magnetic field is disposed, and its terminal 104A projects outward by way of the substrate 101.

An elastic spring 105 is fixed on the top of the disk 103C so as to rotate together with the rotary member 103. A protruding contact portion 105A disposed on the elastic spring 105 elastically contacts with undulations 106 formed regularly at the lower side of the top of the case 102.

The conventional magnetic rotary manipulation type input device is composed in such manner. When the rotary member 103 is rotated by turning the operation shaft 103B projecting outward, the magnet of the disk 103C is turned together with to change the distribution state of the magnetic field. Fluctuations of the magnetic field intensity are read by the detecting element 104, and a specified signal is sent out from the terminal 104A.

At this time of rotary manipulation, the elastic spring 105 elastically slides on the undulations 106 in a direction indicated by arrow 107 in FIG. 5, and thereby produces a click-feeling.

This click-feeling is transmitted to the user as a sense of rotary manipulation at the time of rotation.

This elastic spring 105 also functions as rotation preventive mechanism to prevent issue of wrong signal due to unexpected rotation of the rotary member 103 in an ordinary state not manipulated by rotation. In the ordinary state, the contact portion 105A is stopped so as to press the side portion of the dents of the undulations 106 by a specified elastic force.

In such conventional magnetic rotary manipulation type input device, however, while the click-feeling is generated at the time of rotary manipulation by combining the elastic spring 105 formed by bending process and the undulations 106 of the case 102, intensity changes of the magnetic field due to move of the magnet attached to the rotary member 103 are detected by the detecting element 104 so as to obtain the amount of rotation of the rotary member 103 or the like. It was hence difficult to synchronize between the rotary click-feeling and signal output.

Or by repeating rotary manipulation, the undulations 106 of the case 102 are worn, and deterioration of rotary click-feeling is likely to occur.

SUMMARY OF THE INVENTION

A rotary manipulation type input device comprises:

an operating element for rotary manipulation;

a ring-shaped magnet magnetized in plural poles, being fitted to the lower side of the operating element concentrically in the center of rotation;

a base for rotatably supporting the operating element;

a detecting element for detecting the rotation of the ring-shaped magnetic due to rotary manipulation of the operating element without making contact; and a magnetic element fitted to the base so as to confront the ring-shaped magnet, for generating an operation contact click-feeling by forming an attractive and repulsive force against the ring-shaped magnet.

An electronic apparatus comprises:

a memory unit storing plural pieces of data;

a display unit for displaying at least a part of data stored in the memory unit;

the rotary manipulation type input device mentioned above; and a switch, in which a desired item is searched from the data stored in the memory unit by rotating the operating element, and the searched item is determined by manipulating the switch.

DETAILED DESCRIPTION OF THE EXEMPLARY EMBODIMENTS

The invention is directed to solve the problems of the prior art, and it is hence an object thereof to present a magnetic rotary manipulation type input device easy to synchronize the rotary contact click-feeling and signal output, and free from deterioration of rotary contact click-feeling if manipulation is repeated, and an electronic apparatus using the same.

An embodiment of the invention is described below, referring to FIG. 1 to FIG. 3.

(Embodiment)

Figure 1:
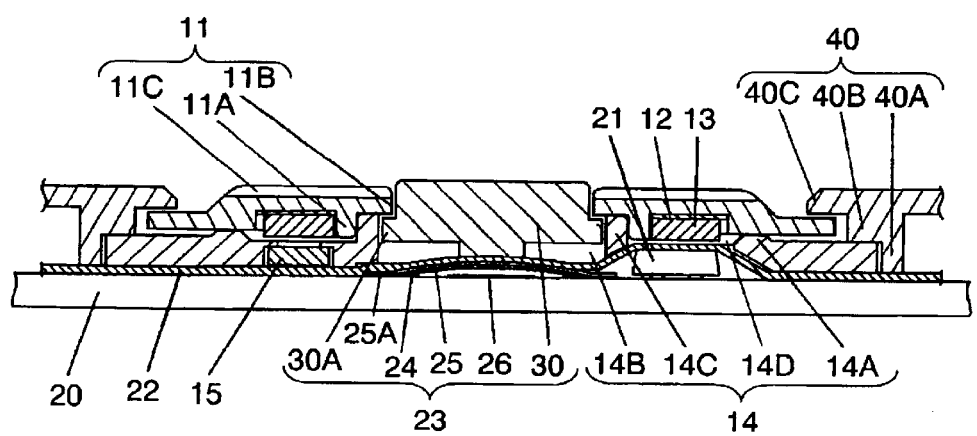
FIG. 1 is a sectional view of a rotary manipulation type input device in an embodiment of the invention.
Figure 2:
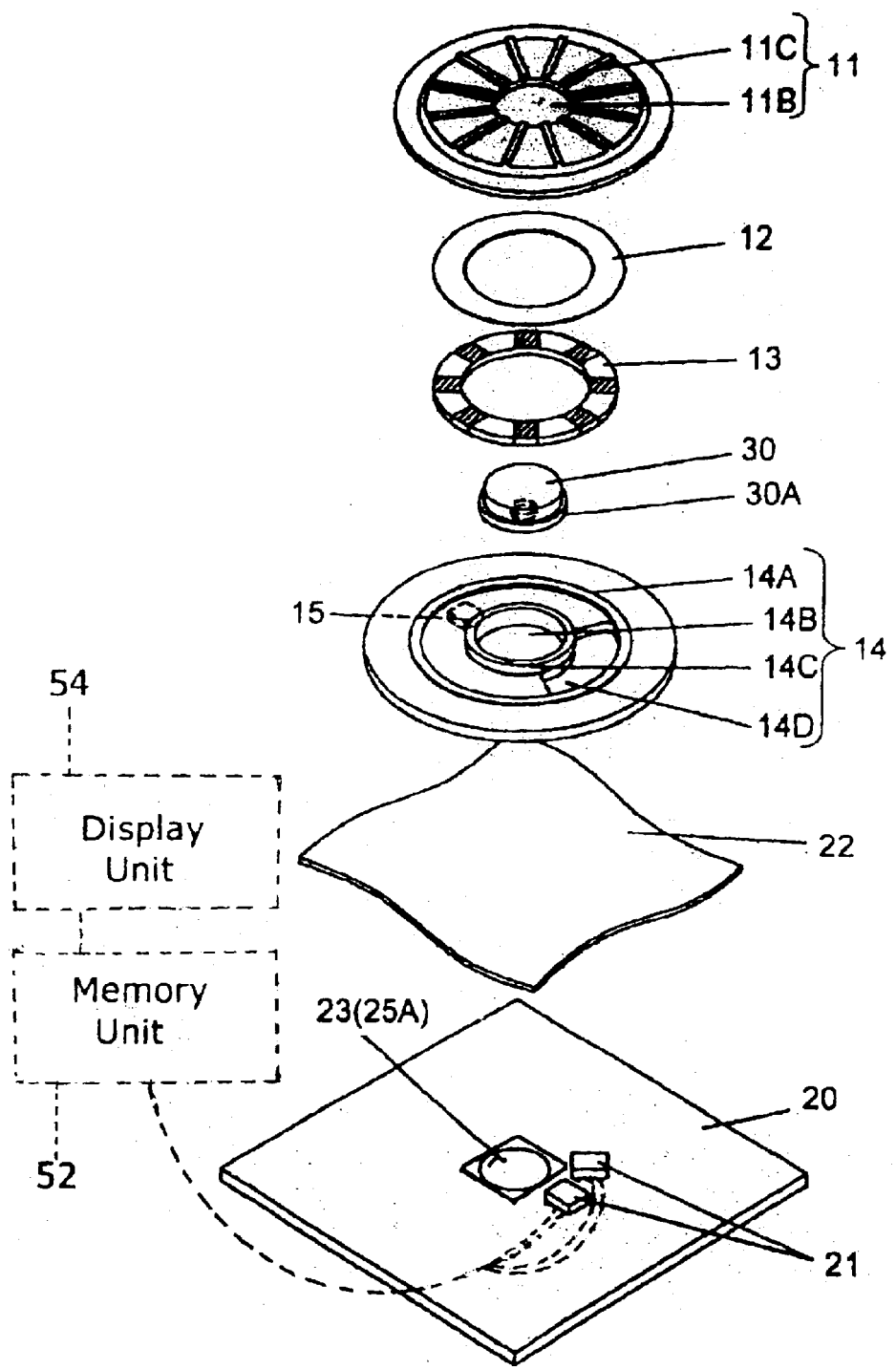
FIG. 2 is a perspective exploded view of the rotary manipulation type input device shown in FIG. 1.

FIG. 1 is a sectional view of a rotary manipulation type input device in an embodiment of the invention, and FIG. 2 is its perspective exploded view. In FIG. 1 and FIG. 2, an operating element 11 is made of resin, and is formed substantially in a circular ring. At its lower side, a magnetic plate 12 made of silicon steel or magnetic stainless steel similarly processing in a ring form is disposed, and a ring-shaped magnet 13 is overlaid concentrically beneath it.

The magnetic plate 12 and ring-shaped magnet 13 are integrally fixed to the operating element 11 precisely by insert forming process.

The ring-shaped magnet 13 has its N poles and S poles magnetized at specified angle alternately or in the same polarity only.

In FIG. 2, for the ease of understanding, the magnetized portion of the ring-shaped magnet 13 is indicated by shaded area.

The ring-shaped magnet 13 is composed of individual magnets linked by means of resin to form a ring shape, or is formed in a C-shape in a top view with an opening in one part.

The operating element 11 is rotatably supported on a ring-shaped wall 14A provided on the outer periphery of the top of a base 14 in which a magnet 15 for generating manipulation contact click-feeling is fixed.

The magnet 15 and the lower side of the ring-shaped magnet 13 are disposed face to face while maintaining a specified interval in the vertical direction.

The magnet 15 for generating manipulation contact click-feeling is a mere magnetic element.

The base 14 is also formed in a ring shape having a penetration hole 14B in the center, and a hole 14D is provided in a specified angle range between the inner tube 14C and ring-shaped wall 14A.

As shown in FIG. 1, the outer peripheral wall of the inner tube 14C of the base 14 is rotatably engaged with the inner periphery of a defining wall 11A of circular ring form provided at the lower side of the operating element 11.

On the other hand, on the top of a substrate 20, one or a plurality of detecting elements 21 capable of detecting intensity changes of magnetic field such as MR elements are mounted and installed at specified angle positions. To cover the detecting elements 21, an elastic insulating sheet 22 is provided.

A mechanical section comprising the operating element 11, magnetic plate 12, ring-shaped magnet 13 and base 14 is combined on the insulating sheet 22.

That is, the detecting element 21 is positioned in the hole 14D of the base 14 through the insulating sheet 22 so as to be opposite to the ring-shaped magnet 13 in the vertical direction, and the lower side of the ring-shaped magnet 13 and the upper side of the insulating sheet 22 on the detecting element 21 are combined so as to be disposed across a slight gap in the vertical direction.

Thus, the ring-shaped magnet 13 is opposite to the detecting elements 21 mounted on the substrate 20 through the insulating sheet 22.

A press switch 23 is disposed at the position of the substrate 20 confronting the penetration hole 14B provided in the center of the base 14 in the vertical direction.

The composition of the switch 23 is not particularly specified, but in this embodiment, the lower end of the outer periphery of a movable contact 25 processed in an upward convex dome shape made of a thin elastic metal plate is put on an outside fixed contact 24 disposed on the substrate 20, and the lower side of the center of the movable contact 25 is opposite to a central fixed contact 26 disposed on the substrate 20 at a specified interval.

The switch 23 having such composition is preferred because the thickness of the switch contact portion can be decreased.

The movable contact 25 is adhered and fixed to the top of the substrate 20 by means of an elastic insulating tape 25A.

An operation button 30 is put on the insulating tape 25A of the switch contact portion by way of the insulating sheet 22. This operation button 30 is disposed inside of the penetration hole 14B of the base 14, and the periphery of a flange 30A is defined by the inner wall of the inner tube 14C of the base 14 so as to be movable in the vertical direction. The top of the flange 30A abuts against the lower side of the periphery of the circular central hole 11B of the operating element 11, and thereby the upward position is defined.

Since the insulating sheet 22 is put on the switch contact portion of the switch 23 and the detecting element 21, the switch contact area of the substrate 20 and the mounting area of the detecting element 21 are protected, and protection from dust and liquid drops is excellent.

Further, by covering all parts mounted on other positions of the substrate 20 by this insulating sheet 22, the entire substrate 20 is protected from dust and liquid drops.

On the top of the operating element 11, small radiant protrusions 11C are provided at equal intervals on the concentric circumference in the center of rotation of the operating element 11.

The upper end of the operation button 30 is exposed upward from the circular central hole 11B of the operating element 11, and its height position is same as or slightly higher than the small protrusions 11C of the operating element 11.

A fixing member 40 is made of a housing or the like, and the insulating sheet 22 is pressed down tightly on the substrate 20 at the leading end of a leg 40A projecting downward, and the base 14 is positioned and fixed by an inner step 40B provided in the leg 40A.

This fixing member 40 is not shown in FIG. 2.

Further inside of the inner step 40B, a protruding upper wall 40C is provided, and is designed to cover above the top peripheral portion not provided with the small protrusions 11C of the operating element 11 across a specified interval. By this upper wall 40C, the operating element 11 is prevented from slipping out upward.

That is, the specified range of the top center of the operating element 11 and the operation button 30 of the switch 23 disposed inside of the operating element 11 are designed to be exposed from the fixing member 40.

The rotary manipulation type input device of the embodiment is a magnetic mechanism being thus composed, and its operation is as explained below.

First, a case of manipulating the top of the ring-shaped operating elemental by rotating on the horizontal plane by a finger is explained. The operating element 11 rotates horizontally as being defined by the outer wall of the inner tube 14C of the base 14, and the ring-shaped magnet 13 rotates at the same time because it is fixed thereto.

At this time, since small protrusions 11C are formed on the operating element 11, the finger catches the small protrusions 11C. Therefore, the finger does not slip and it is easy to manipulate in a simple structure, and this rotation is continuous without leaving the finger.

Along with rotation of the ring-shaped magnet 13, the distribution profile of the magnetic field varies, and intensity changes of the magnetic field are detected by the detecting element 21, and an output of specified rotation information is obtained from the detecting element 21.

Since two or more detecting elements 21 are provided, by disposing them so that their outputs are obtained as pulse outputs having a phase difference, both of the rotating distance and rotating direction can be detected. That is, a function as a so-called rotary type encoder is realized.

Moreover, since the magnetic plate 12 is interposed between the operating element 11 and ring-shaped magnet 13, magnetic field leaking outside from the top of the operating element 11 can be cut off, and the intensity of the magnetic field is increased in the lower part of the ring-shaped magnet 13 where the magnetic plate 12 is not provided. As a result, the intensity of the magnetic field varies along with the rotation of the operating element 11, so that the precision of detection is very high.

On the other hand, during rotary manipulation on the operating element 11, the magnet 15 for generating manipulation click-feeling disposed in the base 14 repeats attraction and repulsion against the ring-shaped magnet 13, and this attractive and repulsive force is obtained as a manipulation click-feeling.

At this time, the intensity of the magnetic field from the ring-shaped magnet 13 is strong as mentioned above, and a favorable manipulation click-feeling is obtained.

Thus, according to the embodiment, a specified output is obtained from the detecting element 21 when the intensity of the magnetic field varies due to rotation of one ring-shaped magnet 13. At the same time, the attractive and repulsive force against the magnet 15 is obtained as a rotation click-feeling, so that the signal output and rotation click-feeling can be synchronized easily.

If desired to form at lower cost in this constitution, only one pole is magnetized in the ring-shaped magnet 13, and the magnet 15 is replaced by a mere magnetic element.

If rotary manipulation of the operating element 11 is a different method, the same effects are obtained.

In an ordinary state without rotary manipulation, the operating element 11 is stopped at the balanced position of magnetic field between the magnet 15 and ring-shaped magnet 13, and it does not rotate unexpectedly.

When the operation button 30 exposed from the circular central hole 11B of the operating element 11 is pressed, that is, when the switch 23 is pressed, the operation is as follows. As indicated by arrow 50 in FIG. 3, when the upper end of the operation button 30 is pressed down by a finger or the like, the operation button 30 moves downward while the periphery of the flange 30A is defined by the inner peripheral wall of the inner tube 14C of the base 14, and the center of the movable contact 25 is pressed by the lower end of the operation button 30 by way of the insulating sheet 22.

Figure 3:
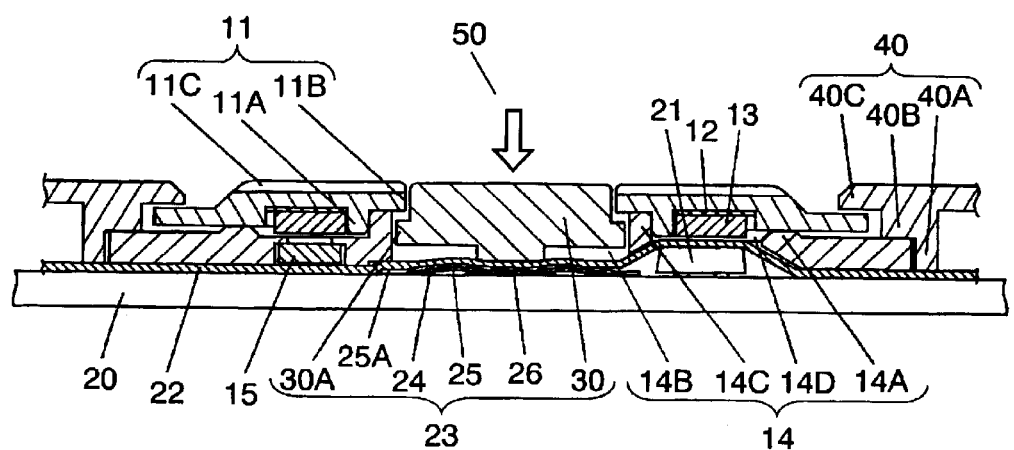
FIG. 3 is a sectional view explaining the pressing operation state of the switch in the rotary manipulation type input device shown in FIG. 1.
Figure 4:
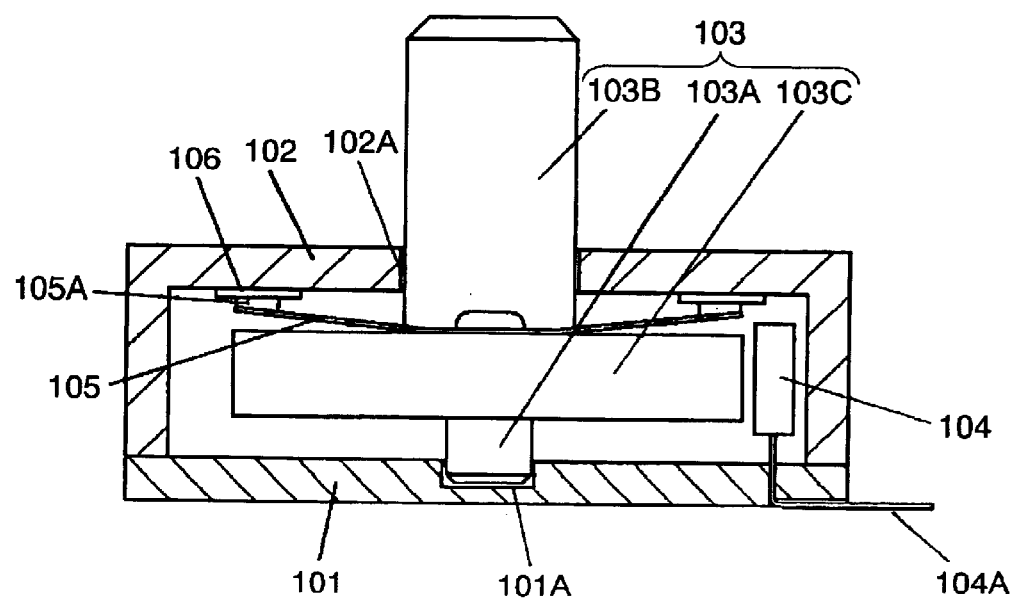
FIG. 4 is a sectional view of a conventional magnetic rotary manipulation type input device.
Figure 5:
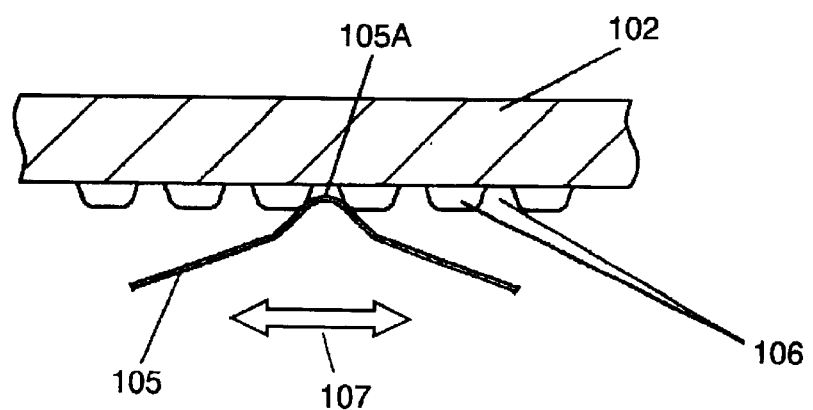
FIG. 5 shows a rotary manipulation click-feeling generating mechanism as an essential part of the rotary manipulation type input device shown in FIG. 4.

When a specified pressing force is applied, as shown in FIG. 3, the movable contact 25 is inverted properly with tactile-feeling, and the central lower side contacts with the central fixed contact 26. As a result, the outside fixed contact point 24 on which the outer lower end of the movable contact 25 is placed and the central fixed contact 26 are electrically connected, and leader portions being led out from the both fixed contacts 24 and 26 conduct with each other (not shown).

When the pressing force on the operation button 30 is removed, the movable contact 25 restores its original shape by the own elastic restoring force, and the central lower side is parted from the central fixed contact 26, and the outside fixed contact 24 and central fixed contact 26 are electrically isolated again, and the operation button 30 is pushed up to the original position by the restoring force.

In this pressing manipulation, when the operating element 11 positioned on the periphery of the operation button 30 is touched by a finger or the like, since the operating element 11 is fixed at the balanced position of magnetic field of the magnet 15 and ring-shaped magnet 13, error signal is not generated.

The rotary manipulation and pressing manipulation are conducted within the circular area of the outer periphery of the operating element 11 in the outside diameter, and the finger moving distance is short, and manipulation can be continued smoothly.

Besides, the rotary click-feeling generating mechanism as rotation preventive mechanism of the operating element 11 is composed without making contact, by making use of attractive and repulsive force of the magnet 15 and ring-shaped magnet 13, and therefore deterioration of rotary contact click-feeling is very small, and a favorable rotary contact click-feeling can be always obtained.

Thus, in the rotary manipulation type input device of the invention, the rotary click-feeling and signal output can be synchronized easily, and rotary click-feeling is not deteriorated if rotary manipulation on the operating element 11 is repeated.

Various electronic apparatuses mounting the rotary manipulation type input device of the embodiment of the invention are explained below.

An electronic apparatus (as illustrated in FIG. 2) comprises a memory unit 52, a display unit 54, and a rotary manipulation type input device having a switch 23 disposed inside of an operating element 11 as explained in the embodiment. The memory unit stores data such as telephone directory in a specified array. For example, on the basis of a first signal from the detecting element 21 obtained by rotary manipulation of the operating element 11, a telephone number is selected as a desired item from the data such as telephone directory stored in the memory unit 52. In this process, a necessary portion of the data stored in the memory unit 52 is properly displayed in the display unit 54. On the basis of a second signal obtained in the conductive state of the switch contact by pressing manipulation of the switch 23, operations of decision and setting the selected telephone number, transmitting it, or the like are executed.

This is only one example of usage, and various functions are realized by assigning the first signal and second signal with necessary functions.

At this time, the rotary manipulation and pressing manipulation can be done easily and continuously in a small finger movement, so that an electronic apparatus excellent in controllability is realized.

Having the switch 23, two individual signals are obtained, and it is easy to follow up diversity of the appliance functions, or if switch 23 is not provided, since deterioration of manipulation contact click-feeling is small, an excellent controllability is obtained.

This rotary manipulation type input device is very thin, if the switch 23 is provided, and is small and compact in the projection area corresponding to the manipulating range, so that it is easily applicable to thinner or smaller apparatuses.

When the manipulation on the operating element 11 is rotary manipulation on a horizontal plane at the upper side, it is applicable to a thinner appliance, but when used in an ordinary rotary manipulation of an operation knob, the operating element is rotated by holding its periphery.

The switch 23 is not limited to the shown structure, but, for example, a slide type is used, or a multi-directional operation type having plural switch contacts or combination of such types is also applicable.

The rotary manipulation type input device of the invention is designed to detect the rotary information by the detecting element, using the ring-shaped magnet installed at the lower side of the operating element for generating signal, and a magnetic element is disposed at a position corresponding to the ring-shaped magnet, and an attractive and repulsive force generated against the ring-shaped magnet is detected as sensation of rotary manipulation. Therefore it can realize a magnetic rotary manipulation type input device easy to synchronize between the rotary click-feeling and signal output, and free from deterioration of rotary click-feeling if manipulation is repeated.

By using the magnetic plate, magnetic field leaking out from the operating unit can be cut off, and the intensity of the magnetic field is increased beneath the ring-shaped magnet where magnetic plate is not provided. Accordingly, only by disposing the detecting element or magnetic element beneath the ring-shaped magnet, detection of rotary information at high precision and favorable rotary click-feeling can be obtained.

Besides, by inserting a sheet between the mechanical block comprising the operating element, ring-shaped magnet and base, and the substrate on which the detecting element is mounted, it is excellent dust-proof and drip-proof performance.

By forming the operating element in a ring shape and disposing the switch at the inside position of the operating element, a first signal is obtained by rotary manipulation on the operating element, and a second signal is obtained by manipulation of the switch disposed inside. In addition, since the switch is disposed in the operating element, the projection area is smaller. When the top of the operating element is manipulated by rotating on a horizontal plane, the operating element can be rotated continuously without leaving the finger, and the switch can be manipulated smoothly by moving the finger only slightly in succession to rotary manipulation.

Small protrusions are formed at equal intervals on the concentric circumference in the center of rotation of the operating element, on the top of the operating element, and the finger catches against the small protrusions when rotating the top of the operating element on a horizontal plane, and the finger hardly slips, and it is easier to manipulate in a simple structure.

The electronic apparatus of the invention is realized by an example comprising at least a memory unit storing plural pieces of data, a display unit for displaying the stored data, and a rotary manipulation type input device, in which a desired item is searched from the data stored in the memory unit by rotating the operating unit, and the searched item is decided by manipulating the switch disposed inside of the operating element. The top of the operating unit of the rotary manipulation type input device is exposed from the appliance housing, and its top is rotated on a horizontal plane, and therefore search from data and decision can be done by a small finger motion, so that an easy-to-use appliance excellent in controllability is realized.

The invention also brings about merits of realizing the magnetic rotary manipulation type input device easy to synchronize between the rotary click-feeling and signal output, and free from deterioration of rotary click-feeling if manipulation is repeated, and the electronic apparatus mounting this rotary manipulation type input device is also excellent in controllability.

This rotary manipulation type input device may also have a switch additionally provided in an area range for rotary manipulation, and when such constitution is installed in an electronic apparatus, an apparatus much easier in use and excellent in controllability is realized.

What is claimed is:

1. A rotary manipulation type input device comprising:

an operating element for rotary manipulation;

a ring-shaped magnet magnetized in plural poles, being fitted to the lower side of said operating element concentrically in the center of rotation;

a base for rotatably supporting said operating element;

a detecting element for detecting the rotation of said ring-shaped magnet due to rotary manipulation of said operating element without making contact;

a magnetic element fitted to said base so as to confront said ring-shaped magnet, for generating an operation contact click-feeling by forming an attractive and repulsive force against said ring-shaped magnet; and a magnetic plate disposed between said operating element and said ring-shaped magnet.

2. A rotary manipulation type input device comprising:

an operating element for rotary manipulation;

a ring-shaped magnet magnetized in plural poles, being fitted to the lower side of said operating element concentrically in the center of rotation;

a base for rotatably supporting said operating element;

a detecting element for detecting the rotation of said ring-shaped magnet due to rotary manipulation of said operating element without making contact;

a magnetic element fitted to said base so as to confront said ring-shaped magnet, for generating an operation contact click-feeling by forming an attractive and repulsive force against said ring-shaped magnet; and a mechanical block comprising said operating element, said ring-shaped magnet and said base;

a substrate on which said detecting element is mounted; and a insulating sheet disposed between said mechanical block and said substrate.

3. A rotary manipulation type input comprising:

an operating element for rotary manipulation;

a ring-shaped magnet magnetized in plural poles, being fitted to the lower side of said operating element concentrically in the center of rotation;

a base for rotatably supporting said operating element;

a detecting element for detecting the rotation of said ring-shaped magnet due to rotary manipulation of said operating element without making contact;

a magnetic element fitted to said base so as to confront said ring-shaped magnet, for generating an operation contact click-feeling by forming an attractive and repulsive force against said ring-shaped magnet; and a switch positioned inside of said operating element, wherein said operating element is shaped like a ring.

4. The rotary manipulation type input device of claim 3, wherein said operating element has small protrusions disposed at equal intervals on the concentric circumference in the center of rotation of said operating element.

5. An electronic apparatus comprising:

a memory unit storing plural pieces of data;

a display unit for displaying at least a part of data stored in said memory unit; and a rotary manipulation type input device comprising:
   an operating element for rotary manipulation of a ring shape having a switch disposed inside;
   a ring-shaped magnet magnetized in plural poles, being fitted to the lower side of said operating element concentrically in the center of rotation;
   a base for rotatably supporting said operating element;
   a detecting element for detecting the rotation of said ring-shaped magnetic due to rotary manipulation of said operating element without making contact; and
   a magnetic element fitted to said base so as to confront said ring-shaped magnet, for generating an operation contact click-feeling by forming an attractive and repulsive force against said ring-shaped magnet,
   wherein a desired item is searched from the data stored in said memory unit by rotating said operating element, and the searched item is determined by manipulating the switch.

* * * * *